US011887743B2

(12) United States Patent
Hayes et al.

(10) Patent No.: US 11,887,743 B2
(45) Date of Patent: Jan. 30, 2024

(54) METAL OXIDE IMPREGNATED CONFORMAL COATINGS FOR IONIZING RADIATION SHIELDING

(71) Applicant: North Carolina State University, Raleigh, NC (US)

(72) Inventors: Robert Bruce Hayes, Clayton, NC (US); Michael Jeffrey DeVanzo, Coatesville, PA (US)

(73) Assignee: NORTH CAROLINA STATE UNIVERSITY, Raleigh, NC (US)

( * ) Notice: Subject to any disclaimer, the term of this patent is extended or adjusted under 35 U.S.C. 154(b) by 469 days.

(21) Appl. No.: 17/233,312

(22) Filed: Apr. 16, 2021

(65) Prior Publication Data

US 2021/0327599 A1   Oct. 21, 2021

Related U.S. Application Data

(60) Provisional application No. 63/012,038, filed on Apr. 17, 2020.

(51) Int. Cl.
| | |
|---|---|
| *G21F 1/08* | (2006.01) |
| *B33Y 70/10* | (2020.01) |
| *B33Y 80/00* | (2015.01) |
| *C09D 1/00* | (2006.01) |
| *C09D 167/07* | (2006.01) |
| *H05K 9/00* | (2006.01) |
| *B82Y 40/00* | (2011.01) |
| *B82Y 30/00* | (2011.01) |

(52) U.S. Cl.
CPC ............... *G21F 1/08* (2013.01); *B33Y 70/10* (2020.01); *B33Y 80/00* (2014.12); *C09D 1/00* (2013.01); *C09D 167/07* (2013.01); *H05K 9/0081* (2013.01); *B82Y 30/00* (2013.01); *B82Y 40/00* (2013.01)

(58) Field of Classification Search
CPC ............ G21F 1/00; G21F 1/106; G21F 1/125
See application file for complete search history.

(56) References Cited

U.S. PATENT DOCUMENTS

| | | | |
|---|---|---|---|
| 2003/0102445 A1* | 6/2003 | Kamoshida | ............... G21F 1/10 250/507.1 |
| 2022/0195203 A1* | 6/2022 | Kim | ..................... H10K 85/151 |

FOREIGN PATENT DOCUMENTS

WO    WO-2013058141 A1 *   4/2013   ............. B32B 27/00

OTHER PUBLICATIONS

Mahmoud et al., "Fabrication, characterization and gamma rays shielding properties of nano and micro lead oxide-dispersed-high density polyethylene composites," Radiation Physics and Chemistry, vol. 145, pp. 160-173 (2018).

(Continued)

*Primary Examiner* — David E Smith
*Assistant Examiner* — Hsien C Tsai
(74) *Attorney, Agent, or Firm* — Jenkins, Taylor & Hunt, P.A.

(57) ABSTRACT

Conformal coatings provide environmental protection for sensitive military electronics. Preliminary MCNP™ modeling of metal oxide impregnated acrylic conformal coatings indicates an effective shield for gammas below 10 keV and a reduction in neutron displacement damage to Si-based electronics across the Watt spectrum. This work provides data which can allow an optimal overall shielding worth per total weight to eventually be evaluated.

25 Claims, 4 Drawing Sheets

(56) References Cited

OTHER PUBLICATIONS

Li et al., "Gamma ray shielding property, shielding mechanism and predicting model of continuous basalt fiber reinforced polymer matrix composite containing functional filler," Materials and Design, vol. 124, pp. 121-130 (2017).
Chai et al., "Preparation and properties of novel, flexible, lead-free X-ray-shielding materials containing tungsten and bismuth(III) oxide," J. Appl. Polym. Sci., pp. 1-8 (2016).
Belgin et al., "Preparation and radiation attenuation performances of metal oxide filled polyethylene based composites for ionizing electromagnetic radiation shielding applications," J Radioanal Nucl Chem, vol. 306, pp. 107-117 (2015).
Soylu et al., "Gamma radiation shielding efficiency of a new lead-free composite material," J. Radioanal Nucl Chem, vol. 305, pp. 529-534 (2015).
Wang et al., "Preparation and Radiation Shielding Properties of Gd2O3/PEEK Composites," Polymer Composites, pp. 651-659 (2015).
"MCNP6 User's Manual," Los Alamos National Security, LLC, Version 1.0, LA-CP-13-00634, Rev. 0, pp. 1-765 (May 2013).
Ma et al., "Fabrication, Structure and Properties of Epoxy/Metal Nanocomposites," Macromol. Mater. Eng., vol. 296, pp. 465-474 (2011).
Harrison et al., "Polyethylene/Boron Nitride Composites for Space Radiation Shielding," Journal of Applied Polymer Science, vol. 109, pp. 2529-2538 (2008).
Srour et al., "Review of Displacement Damage Effects in Silicon Devices," IEEE Transactions on Nuclear Science, vol. 50, No. 3, pp. 653-670 (Jun. 2003).
Kwon et al., "Gamma displacement cross-sections in various materials," Annals of Nuclear Energy, vol. 27, pp. 1627-1642 (2000).
Brydson, "Acrylic Plastics," Plastics Materials, Chapter 15, pp. 1-27 (1999).
"Military Specification. Insulating Compound, Electrical (For Coating Printed Circuit Assemblies)," Department of Defense, MIL-I-46058C, pp. 1-15 (Jul. 7, 1972).
Zoller, "Fast-Neutron-Removal Cross Sections," Nucleonics, vol. 22, No. 8, pp. 128-129 (Aug. 1964).
American Nuclear Society: Nuclear Grand Challenges: Advanced Materials: https://www.ans.org/challenges/materials/ (current as of Nov. 2021).
M. Devanzo & R. B. Hayes, "Ionizing Radiation Shielding Properties of Metal Oxide Impregnated Conformal Coatings," Radiation Physics and Chemistry, 171, 108685 (2020).
H. W. Jones, "The Recent Large Reduction in Space Launch Cost," NASA Ames Research Center, 48th International Conference on Environmental Systems, Albuquerque, NM (Jul. 2018).
L. Varga and E. Horvath, "Evaluation of Electronics Shielding in Micro-satellites," *Defense R&D Canada—Ottawa*, (Feb. 2003).
University of Cambridge: Department of Materials Science and Metallurgy: Derivation of the rule of mixtures and inverse rule of mixtures (current as of Nov. 2021).
J. Chen, J. D. Forney, R. L. Pease et al. "The Effects of ELDRS at Ultra-Low Dose Rates," NASA Electronics Parts and Packaging program, IEEE (Jul. 2010). https://ntrs.nasa.gov/api/citations/20110015280/downloads/20110015280.pdf.

* cited by examiner

METAL OXIDE IMPREGNATED CONFORMAL COATINGS FOR IONIZING RADIATION SHIELDING

RELATED APPLICATIONS

This application claims the priority benefit of U.S. Provisional Patent Application Ser. No. 63/012,038 filed Apr. 17, 2020, the disclosure of which is incorporated herein by reference in its entirety.

GOVERNMENT INTEREST

The present invention was made with United States government support under grant number DE-NA0002576 awarded by the U.S. Department of Energy (DOE) and grant number NRC-HQ-84-14-G-0059 awarded by the United States Nuclear Regulatory Commission (U.S. NRC). The United States government has certain rights in the invention.

TECHNICAL FIELD

The subject matter described herein relates to shielding for electronic devices. More particularly, the subject matter described herein relates to metal-oxide impregnated conformal coatings for ionizing radiation shielding for electronic devices.

BACKGROUND

Electronic devices, such as semiconductor devices, are sensitive to ionizing radiation, such as nuclear particle radiation and photonic radiation. When electronic devices are deployed in environments with high concentrations of ionizing radiation, such as nuclear power generation facilities and spacecraft, it is desirable to shield the electronic components from the ionizing radiation. While using single element metallic shields, such as lead shields, these are effective at blocking ionizing radiation. Metallic shields are expensive in terms of mass penalty, potential toxicity and manufacturing cost and may change circuitry capacitive reactance.

Accordingly, there exists a need for improved methods for providing ionizing radiation shielding for electronic devices that avoids some of these difficulties.

SUMMARY

A method for shielding an electronic device for resistance to nuclear particle and photonic radiation includes mixing a metal oxide with an acrylic resin to form a metal-oxide, acrylic resin composite. The method further includes applying the metal-oxide, acrylic resin composite to surround an electronic device and form a conformal coating that encapsulates the electronic device and shields the electronic device from nuclear particle and photonic radiation. The method further includes curing the metal-oxide, acrylic resin composite to harden the conformal coating that encapsulates the electronic device(s).

According to another aspect of the subject matter described herein, the metal-oxide comprises a powder and mixing the metal oxide with the acrylic resin includes mixing the powder with the acrylic resin to have a desired mass percentage and size distribution of the metal oxide.

According to another aspect of the subject matter described herein, metal oxide comprises erbium trioxide.

According to another aspect of the subject matter described herein, the metal oxide comprises tungsten trioxide.

According to another aspect of the subject matter described herein, the metal oxide comprises gadolinium trioxide.

According to another aspect of the subject matter described herein, applying the metal-oxide, acrylic composite to surround the electronic device comprises dipping the electronic device into the metal-oxide, acrylic composite, brushing or pouring the metal-oxide, acrylic composite onto the electronic device, or spraying the metal-oxide, acrylic composite onto the electronic device.

According to another aspect of the subject matter described herein, applying the metal-oxide, acrylic composite to surround the electronic device includes applying the metal-oxide, acrylic composite to an encapsulant surrounding the electronic device According to another aspect of the subject matter described herein, applying the metal-oxide, acrylic composite to the encapsulant includes 3D printing the metal-oxide, acrylic material onto the encapsulant or machining bulk metal-oxide composite material into a structure for surrounding the encapsulant.

According to another aspect of the subject matter described herein, the encapsulant comprises a ceramic material.

According to another aspect of the subject matter described herein, the ceramic material comprises alumina.

According to another aspect of the subject matter described herein, the electronic device comprises a semiconductor device.

According to another aspect of the subject matter described herein, the semiconductor device includes at least one silicon layer and at least one silicon oxide layer.

According to another aspect of the subject matter described herein, the acrylic resin comprises a polymethyl acrylic resin.

According to another aspect of the subject matter described herein, applying the metal-oxide, acrylic composite to surround the electronic device includes applying plural layers of the metal-oxide, acrylic composite to surround the electronic device.

According to another aspect of the subject matter described herein, a nuclear particle and photonic radiation resistant electronic device comprises a semiconductor device. The nuclear particle and photonic radiation resistant device further comprise a conformal coating that surrounds the semiconductor device and comprises a composite of a metal oxide and an acrylic resin for shielding the semiconductor device from nuclear particle and photonic radiation.

According to another aspect of the subject matter described herein, the semiconductor device includes at least one silicon layer and at least one silicon oxide layer.

According to another aspect of the subject matter described herein, an encapsulant surrounds the semiconductor device, and the conformal coating is located on an outer surface of the encapsulant.

According to another aspect of the subject matter described herein, the encapsulant comprises a ceramic material.

BRIEF DESCRIPTION OF THE DRAWINGS

The subject matter described herein will now be explained with reference to the accompanying drawings of which.

DETAILED DESCRIPTION

1. Introduction

Figure 1:
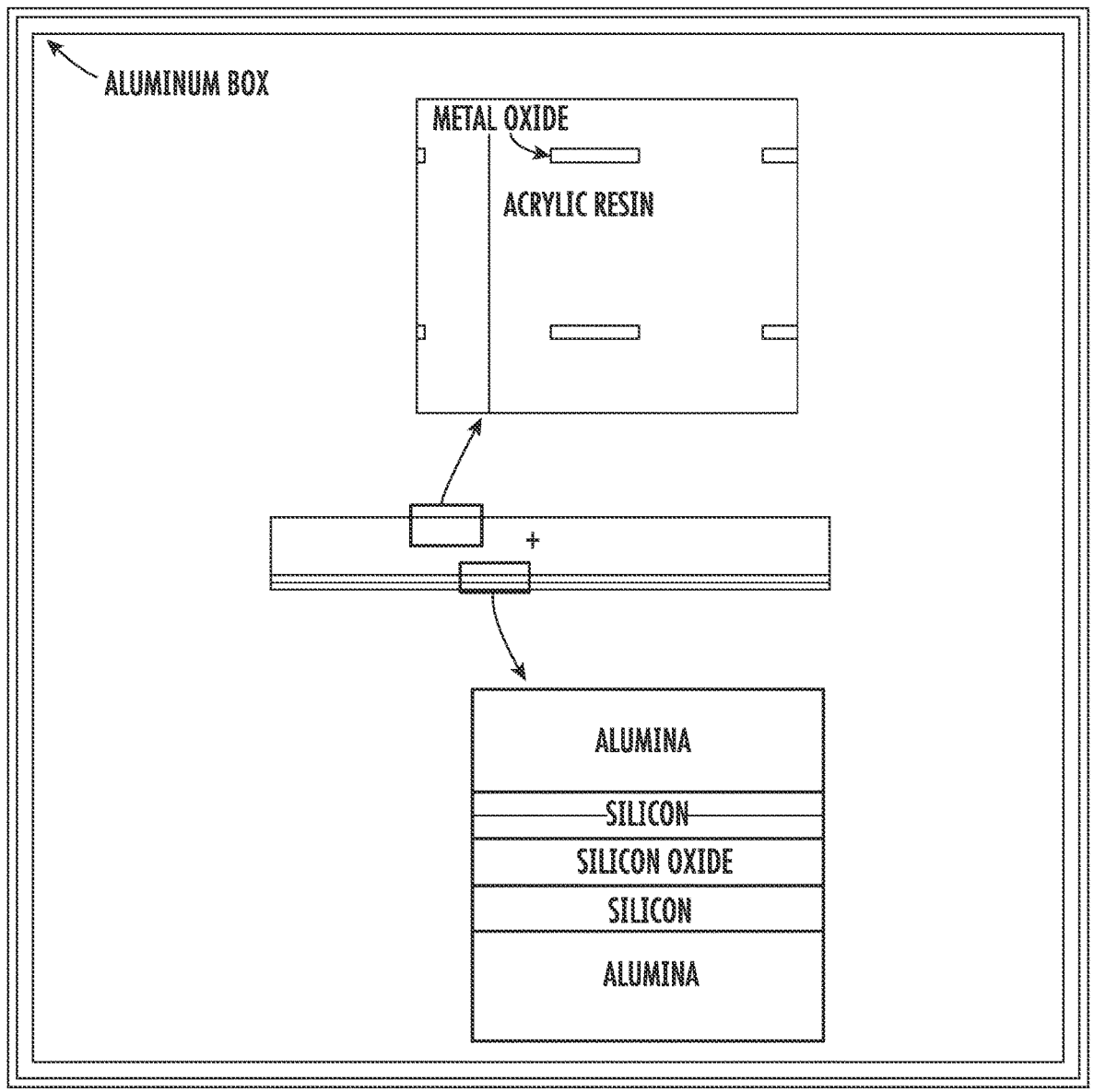
FIG. 1 is a diagram of an electronic device with a metal oxide conformal coating.

Military systems are challenged to perform complex functions in severe natural and hostile environments. Semiconductor devices on-board spacecraft are particularly susceptible to high energy radiation. Incident radiation can instantaneously displace lattice atoms, causing defects within the p-n junction (or sensitive region). These defects can be annealed or recombined on the surface of the semiconductor or at the surface material-oxide interface, but not completely. The accumulated defects manifest in performance degradation (i.e. decreased transistor gain and increased leakage current) which could potentially cause mission failure [Srour (2003)].

Reducing space electronic susceptibility requires novel semiconductor designs and/or effective shielding. Hostile environment protection, particularly from man-made radiation like neutrons and gammas, currently requires conventional shielding materials. Conventional shielding materials like lead, concrete, and aluminum provide structural benefits, but incur a high mass penalty and may not be feasible for future spacecraft designs. Readily available low mass polymers have been proposed for use in several shielding applications [Belgin et al. (2015), Chai et al. (2016), Harrison et al. (2008), Li et al. (2017), Soylu et al. (2015), Wang et al. (2015)]. These materials have an equivalent low atomic number (or low-Z) and can be designed to suit a wide variety of applications. Low-Z coatings, known as conformal coatings, are currently used to protect sensitive electronics from natural environmental conditions, like moisture, shock, and thermal insult. Conformal coatings consist of hydrogen, carbon, and oxygen, which offer some inherent radiation shielding properties, particularly when the mass of the incident particle is similar to the target mass [Faw and Shultis (2000)]. This condition is optimized under neutron irradiation as neutrons readily transfer energy to the hydrogenous component of the conformal coat (i.e. energy downscatter). Fast neutrons incident on conformal coatings are initially deflected and then degraded through the energy dependent removal cross section ($\mu_r(E)$) where $\rho$ is the material density, E is the incident photon energy, $\phi$ is the incident flux and r is the distance traversed into the material.

$$\phi''(0) = \phi^\circ(E)\exp[-\rho r(\mu_r(E))/\rho] \quad (1)$$

For composite materials, a weighted sum can be used to compute the total interaction coefficient for any elemental combination where a particular component of the mix has a weight fraction $W_i$ [Zoller (1964)].

$$(\mu_r/\rho = \Sigma_i W_i(\mu_r/\rho) \quad (2)$$

Low Z elements have little effect on photon attenuation as the probability of interaction is proportional to Z [Faw and Shultis (2000)]. Thus, the inclusion of high Z materials in conformal coatings can provide photon shielding with the polymer matrix still providing some neutron shielding. A wide range of photon energies were evaluated for this study, encompassing photoelectric, Compton scattering, and pair production interactions. Equations 1-3 can be applied to the incident field for any shield material, pending use of the appropriate interaction coefficients which represent the probability of interaction per unit path length ($\mu$) [Faw and Shultis (2000)].

$$(\mu/\rho) = (N_a/A)[\sigma_c(E) + \sigma_{ph}(E) + \sigma_{pp}(E)] \quad (3)$$

Recent material studies have shown that metal oxide (MO)-polymer composites can provide additional shielding for low energy X-ray and higher energy gammas [Harrison (2008)]. Several key themes are noted in the literature: the need for shielding to have acceptable mechanical properties, the exclusion of lead and other toxic materials, and a desire for lightweight human protection. The investigations into structural shielding materials has determined that the addition of MOs with high thermal conductivity, like gadolinium oxide ($G_2O_3$) and tungsten oxide ($WO_2$), can improve mechanical properties, while the inclusion of neutron absorbing materials, like boron nitride, can result in diminished mechanical properties [Harrison et al (2008), Wang et al (2015)]. The high density polymers used in these studies were intended to provide the mechanical properties needed to address structural concerns.

Polymer composites have also been proposed to remove lead from current medical imaging practices. Several researchers have shown that tungsten, bismuth, and gadolinium oxides can be used to reduce X-ray exposure by similar factors when compared to lead, particularly at low energies [Chai et al. (2016), Li et al. (2017)]. As noted by Chai et al. (2016), higher MO mass percentages are associated with higher shielding effectiveness and can result in a higher population of voids on the bulk exterior surface (depending on materials and preparation). While this trade-off is important for structural shielding, it is not as important for conformal coated electronics as they are bonded to rigid printed wiring boards.

Polymer-based conformal coatings are used to protect electronics against various environmental conditions and are attractive candidates for reducing the radiation environment to semiconductors after the addition of specific MO particulate. Conformal coatings are flexible and must meet MIL-I-46058 specifications [USDoD (1972)]. Of the material types allowed, acrylic conformal coatings are arguably the easiest to apply and are noted by some manufacturers as the most popular for this reason [Brydson (1999)]. Incorporating heavy MO into acrylic conformal coatings is offered as a method to address various radiation concerns in a single design. Conducting particulate could also be considered although this generally implies metallic dust. Typically, high Z metals are much costlier than their rusted counterparts in oxides enabling holistic cost and weight reduction with comparable or improved shielding worth. This is an analysis of the shielding effectiveness of a standard conformal coat which was saturated or partially saturated with MO particulate as a composite shielding and sealing material.

2. Theory & Methods

2.1 Theory

Homogeneous shields can use Equation 1 without alteration, while heterogeneous shields require some alteration based on the definition of their distinct regions. In this study, there are two regions defined; a homogeneous bulk acrylic resin region and regions (or pockets) of MO precipitate in the bulk acrylic resin. The probability that incident radiation passes through each region can be determined through transmission probabilities, where the MO thickness (δ) is fixed [Faw and Shultis (2000)]. Here, the energy dependent transmission probability for the mix, $T_{mix}$, is seen as a function of the energy dependent acrylic and MO linear interaction coefficients ($\mu_A$ and $\mu_{MO}$, respectively, Eqn. 4), accounting for the number of MO particulates traversed, n. Scatter components are folded in using the scatter energy accordingly via Monte Carlo (MCNP).

$$T_{mix} = \exp[\mu_A(E)(t-n\delta) + \mu_{MO}(E)n\delta] \quad (4)$$

MO powders that are well mixed in the conformal coat can in some instances provide a reasonable approximation to a homogeneous shield consisting of the same elements as indicated in Equation 2. Note that as the MO mass percent increases, so does the density and effective Z. This serves to increase the photon shielding effectiveness while decreasing neutron shielding effectiveness. Composite density can be computed as the inverse sum of constituent density ratios, where the mass fraction and constituent density is noted with subscript m and F for MO and acrylic, respectively [Mahmoud et al (2018)].

$$\bar{\rho} = [(m/\rho_m) + (F/\rho_F)]^{-1} \quad (5)$$

The composite coating serves to reduce the dose deposited to the sensitive electronics on the printed circuit card underneath. Uncollided dose is the product of the transmitted radiation fluence through the composite φ and the dose response function R(E). This calculation assumes that all photons streaming through the composite are deposited in the semiconductor at the interaction point where the photon is removed from the incident field per Equation. 1 [Faw and Shultis (2000)].

$$\text{Dose} = \int_E \phi(E) R(E) dE \quad (6)$$

Absorbed dose calculations, however, must include the radiation fluence from all interactions. Correspondingly, the semiconductor response function must account for partial energy deposition and radiation loss from the material of interest. The linear energy absorption coefficient ($\mu_{en}(E)/\rho$) describes the response of the material.

$$R(E) = E\mu_{en}(E)/\rho \quad (7)$$

2.1.1 Effects on Electronics

Radiation effects in sensitive regions of electronics are measured in terms of displacement damage, or the physical displacement of atoms from their lattice positions. While all radiation types can displace atoms, nucleon radiation (neutrons, protons) causes significantly more damage than other types due to recoil events. Neutron displacement damage, in terms of displaced atoms per unit shield mass (dpm), can be calculated as noted in Equation 8 [Murty (2013)]:

$$dpm(E) = \begin{cases} 0 & \text{for } E < E_d \\ EN\Lambda\sigma_{el}(E)\phi(E)V_{Si}/4m_m E_d & \text{for } E \geq E_d \end{cases} \quad (8)$$

where E is the incident energy, $E_d$ is the threshold displacement energy (40 eV), N is the atomic density of silicon, $V_{Si}$ is the silicon volume, $m_m$ is the material mass, $\sigma_{el}$ is the elastic scattering cross section, φ(E) is the energy flux distribution, and $\Lambda$ is the energy transfer parameter [Murty (2013)]

$$\Lambda = 4Mm/(M+m)^2$$

where M is the mass of the stationary atom and m is the mass of the incident particle in atomic mass units.

Displacement damage from photons of a given energy is noted to be significantly less than that from neutrons of equal kinetic energy. Photon displacement damage can be calculated as a reaction rate after accounting for secondary electron interactions, to the extent each of these cause displacement damage [Kwon (2000)]. These computed cross sections assumed the same threshold energy as noted for neutrons.

$$dpm(E) = N\sigma_{el}(E)\phi(E)V_{Si}/m_m \quad (9)$$

Photon irradiation has special effects on sensitive electronics, namely the creation of electron-hole (e-h) pairs within sensitive regions. When the incident energy is above the material specific threshold, an e-h pair is created. For silicon, this threshold is 3.6 eV. The volumetric e-h pair generation rate in Si can be calculated through a conversion and is approximately $4 \times 10^{13}$ e-h pairs rad(Si)$^{-1}$ cm$^{-3}$. The creation of e-h pairs in the sensitive region of electronics occurs instantaneously upon incident radiation interaction. These excess charges diffuse through implicit and applied electric fields, generating photocurrents that can cause upsets and circuit burnout [Srour (2003)].

2.2 Modeling of MO-Acrylic Resin

A detailed model was developed using the Monte Carlo N-Particle (MCNP6™) code to determine the shielding effectiveness of MO-acrylic composites [MCNP (2013)]. Three MO powders ($Gd_2O_3$, $WO_3$, and $Er_2O_3$) of increasing mass percent were modeled as individual elements within a polymethyl acrylic resin. Each MO element is modeled as a cylinder with varying diameter and constant height at the center of each lattice cell. Resin filled the balance of each lattice cell; the exact volume and lattice cell dimensions depended on the MO mass percent as noted in Eqn. 10. MO particulate sizes were varied from 10 to 60 micrometers in diameter with an individual thickness of 0.8 micrometers. Current experimental research indicates that smaller particle sizes arranged homogeneously throughout the composite matrix produce greater attenuation [Belgin et al (2015), Ma et al. (2011)]. Composites with MO particulate less than 10 micrometers in diameter were found to transport improperly with MCNP.

$$\% \, m_{MO} = 100 * (\text{mass}_{MO}/\text{mass}_{total}) \quad (10)$$

The x and y dimensions of the total composite were constant at 2 cm, while the z dimension (or thickness) of the composite was 0.2 cm for a single layer, up to 0.8 cm for a quadruple layer. A URAN card was used to provide stochastic variations in the position of the MO within a lattice cell for low mass percent cases. Modeling for higher mass percentages (above 30 to 40%) required that the MO fill the lattice in the x and y dimension. The modeling approach ensured that incident radiation had a high probability of interacting with high Z material. This also eliminated the potential for random placement, which is a realistic possibility [Brydson].

The composite conformal coat is intended to provide environmental (humidity, dust, shock, etc.) protection as well as radiation protection to sensitive electronics. Protected electronics were modeled as generic ceramic encapsulated silicon devices. The sensitive silicon is encased, or encapsulated, in a ceramic material (Alumina). Since electronics manufacturers hold the specifics of their design as proprietary, the thickness of the encapsulant was assumed to be 10 mils above and below the silicon. Any similarity to a manufacturer's design is unintentional and purely coincidental. All materials modeled are displayed in Table 1. It should be noted that the conformal coating and MO powders are commercially available and were chosen specifically to allow for rapid testing and development.

TABLE 1

Materials modeled in MCNP6 ®

| Material | Manufacturer | Item Number | Density | Cost |
|---|---|---|---|---|
| Conformal Coating | MG Chemicals Ltd. | 419D | 1.22 g cm$^{-3}$ | $0.05/mL |
| Er$_2$O$_3$ powder | Millipore-Sigma | 289248 | 8.64 g cm$^{-3}$ | $6.6/g |
| Gd$_2$O$_3$ powder | Millipore-Sigma | 48220 | 7.41 g cm$^{-3}$ | $3.3/g |
| WO$_3$ powder | Millipore-Sigma | 204781 | 7.16 g cm$^{-3}$ | $11.6/g |
| Alumina (Al$_2$O$_3$) | Elan Technology | N/A | 3.72 g cm$^{-3}$ | N/A |

Planar incident radiation sources were applied normal to a 20 mil thick Al enclosure which protected the composite. This was done to replicate the composites usage on a circuit board inside an electronics box or module. A graphic of the set-up is shown in FIG. 1. Transport calculations were run with and without an Al enclosure to provide a shielding worth comparison. Photons and neutrons were applied separately to determine the composites individual shielding worth. The photon sources were mono-energetic with energies between 0.01 and 14 MeV. A Watt spectrum (thermal neutron induced U$^{238}$ fission; a=0.965 MeV, b=2.29 MeV$^{-1}$, and C=0.4527) was applied as the neutron source.

$$F(E)=C \exp(-E/a)\sin h(\sqrt{b*E}) \tag{11}$$

The energy spectrum of the incident flux and composite attenuated flux was tracked through a surface and cell flux tally (F2 and F4 tally, respectively) for both radiation types. The ENDF/B-VI.8 cross section data was used for all transport and reaction calculations.

3. Results 3.1 Photons

Monoenergetic, planar photon sources were normally incident on the set up indicated in FIG. 1 with and without the Al enclosure. The composite conformal coating provides an Al-equivalent level of shielding or better to photon energies of 0.01 to 14 MeV. Table 2 shows the photon fluence above 10 keV is consistent with or without the Al enclosure. At 10 keV, the photon fluence through the Al enclosure is 100× less with than without the Al enclosure. Table 3 shows the ratio of the composite conformal coat attenuation without the Al enclosure to the standard conformal coat attenuation of the same thickness within the Al enclosure. The inclusion of 30% by mass or greater MO particulate increases the shielding worth for incident photon energies between 10 keV and 400 keV. Beyond 400 keV, the attenuation effectiveness of the metal oxide reduces to within 5% of the standard conformal coat. As a general rule, use of the MO has a realistic shielding improvement across the energy spectrum.

The shielding provided for photons >10 keV is the same or greater with the composite conformal coating. At 10 keV, the apparent benefit from the 100× reduction in photon fluence to the conformal coating with the Al enclosure is negated by the >100× increase in attenuation with the composite conformal coating. The greatest 10 keV attenuation was observed with Er$_2$O$_3$ at 30% and greater mass %. Attenuation of higher energy photons was observed with four layers of composite; the most pronounced attenuation was with a quad layer of 70% 60 µm Er$_2$O$_3$. The heaviest composite conformal coat, corresponding to four layers of 60 µm MO particulate at 70% by mass composition, is 13% denser than Al. This is typical of all high mass % conformal coatings. A noteworthy result is that 30% MO by mass composite conformal coats are up to 40% lighter than Al and have a similar attenuation ratio at 10 keV.

TABLE 2

Relative photon fluence at the surface of the conformal coating with and without Al enclosure. Errors for all values are less than 1%.

| | Energy (MeV) | | | | | |
|---|---|---|---|---|---|---|
| Composition | 0.01 | 0.1 | 0.2 | 0.4 | 0.6 | 0.8 |
| Single Layer | | | | | | |
| Without Al | 0.00206 | 0.0213 | 0.0206 | 0.0203 | 0.02016 | 0.0201 |
| with Al | 0.000213 | 0.0209 | 0.0206 | 0.0204 | 0.0203 | 0.0202 |
| Double layer | | | | | | |
| Without Al | 0.0228 | 0.0237 | 0.0232 | 0.0229 | 0.0227 | 0.0227 |
| With Al | 0.000256 | 0.0237 | 0.023 | 0.0230 | 0.0229 | 0.0228 |
| Triple Layer | | | | | | |
| Without Al | 0.0257 | 0.0268 | 0.0263 | 0.0260 | 0.0258 | 0.0257 |
| With Al | 0.000282 | 0.0269 | 0.0265 | 0.0261 | 0.0259 | 0.02582 |
| Quadruple Layer | | | | | | |
| Without Al | 0.0292 | 0.0306 | 0.03005 | 0.0296 | 0.0294 | 0.0293 |
| With Al | 0.000309 | 0.0306 | 0.0302 | 0.0298 | 0.0296 | 0.0294 |

TABLE 3

Comparison of photon attenuation as a ratio of composite conformal coat attenuation without the Al enclosure to the standard conformal coat attenuation with the Al enclosure.

| | Energy (MeV) | | | | | |
|---|---|---|---|---|---|---|
| Composite | 0.01 | 0.1 | 0.2 | 0.4 | 0.6 | 0.8 |
| Single layer | | | | | | |
| 10% 10 µm Er$_2$O$_3$ | 36.2 | 1.07 | 1.01 | 1.001 | 1.001 | 1 |
| 30% 30 µm Er$_2$O$_3$ | 888 | 4.3 | 1.3 | 1.06 | 1.03 | 1.02 |
| 70% 60 µm Er$_2$O$_3$ | 964 | 4.3 | 1.3 | 1.05 | 1.03 | 1.02 |
| 30% 30 µm Gd$_2$O$_3$ | 672 | 3 | 1.2 | 1.05 | 1.02 | 1 |
| 70% 60 µm Gd$_2$O$_3$ | 138 | 1.9 | 1.1 | 1.02 | 1.01 | 1 |
| 30% 30 µm WO$_3$ | 244 | 4.03 | 1.31 | 1.06 | 1.03 | 1.02 |
| 70% 60 µm WO$_3$ | 254 | 4 | 1.31 | 1.06 | 1.03 | 1.02 |
| Double Layer | | | | | | |
| 10% 10 µm Er$_2$O$_3$ | 5.67 | 1.03 | 1.002 | 0.99 | 0.99 | 0.99 |
| 30% 30 µm Er$_2$O$_3$ | 442 | 12 | 1.7 | 1.1 | 1.06 | 1.04 |
| 70% 60 µm Er$_2$O$_3$ | 438 | 12.1 | 1.7 | 1.12 | 1.06 | 1.04 |
| 30% 30 µm Gd$_2$O$_3$ | 316 | 7.3 | 1.5 | 1.1 | 1.05 | 1.03 |
| 70% 60 µm Gd$_2$O$_3$ | 327 | 7.3 | 1.5 | 1.1 | 1.05 | 1.03 |
| 30% 30 µm WO$_3$ | 110 | 11 | 1.7 | 1.11 | 1.05 | 1.03 |
| 70% 60 µm WO$_3$ | 108 | 11 | 1.7 | 1.1 | 1.06 | 1.03 |
| Triple Layer | | | | | | |
| 10% 10 µm Er$_2$O$_3$ | 1.93 | 1.02 | 1.003 | 1.002 | 1 | 1 |
| 30% 30 µm Er$_2$O$_3$ | 224 | 18.3 | 2.09 | 1.18 | 1.09 | 1.05 |
| 70% 60 µm Er$_2$O$_3$ | 249 | 18.3 | 2.09 | 1.18 | 1.09 | 1.06 |
| 30% 30 µm Gd$_2$O$_3$ | 179 | 12 | 2 | 1.2 | 1.08 | 1.05 |
| 70% 60 µm Gd$_2$O$_3$ | 186 | 12 | 1.7 | 1.1 | 1.06 | 1.05 |
| 30% 30 µm WO$_3$ | 66 | 17 | 2.1 | 1.2 | 1.08 | 1.05 |
| 70% 60 µm WO$_3$ | 63 | 17 | 2.1 | 1.2 | 1.08 | 1.05 |
| Quadruple Layer | | | | | | |
| 10% 10 µm Er$_2$O$_3$ | 1.31 | 1.02 | 1.006 | 1.005 | 1 | 1 |
| 30% 30 µm Er$_2$O$_3$ | 169 | 20.1 | 2.5 | 1.23 | 1.12 | 1.08 |
| 70% 60 µm Er$_2$O$_3$ | 157 | 20.2 | 2.48 | 2.5 | 1.23 | 1.12 |
| 30% 30 µm Gd$_2$O$_3$ | 122 | 14 | 2 | 1.2 | 1.1 | 1.06 |
| 70% 60 µm Gd$_2$O$_3$ | 124 | 14 | 2 | 1.2 | 1.1 | 1.06 |

TABLE 3-continued

Comparison of photon attenuation as a ratio of composite conformal coat attenuation without the Al enclosure to the standard conformal coat attenuation with the Al enclosure.

| Composite | Energy (MeV) | | | | | |
|---|---|---|---|---|---|---|
| | 0.01 | 0.1 | 0.2 | 0.4 | 0.6 | 0.8 |
| 30% 30 µm WO$_3$ | 44 | 19 | 2.5 | 1.2 | 1.1 | 1.06 |
| 70% 60 µm WO$_3$ | 41 | 19 | 2.5 | 1.2 | 1.1 | 1.07 |

Incorporating MO particulate into the conformal coat had a minimal effect on photon surface fluence and dose on the silicon at MO mass percent below 30%. Above 30% by mass MO, the composite conformal coat provided notably greater shielding of incident photons up to 200 keV. Thicker conformal coats with 70% by mass MO showed the least photon dose to silicon. This was an expected result based on the larger attenuation coefficients (Eqn. 1-5). Table 4 displays the ratio of the dose to the Si through the standard conformal coat within the Al enclosure to Si dose through the composite conformal coat of the same thickness without the Al enclosure. The dose ratio increases with thickness and saturates quickly with MO composition. It should be noted that 10 keV photon fluence to the all conformal coats were reduced by 100× when contained within the Al enclosure. Si dose ratio through composite conformal coats with the Al enclosure at this energy can be determined by multiplying the values in Table 4 by 100.

TABLE 4

Ratio of Gray(Si) through standard conformal coat (with the Al enclosure) to Gray(Si) through composite conformal coat (without the Al enclosure). The dose ratio at all energies but 10 keV is the same for composite conformal coating with and without the Al enclosure. At 10 keV, the dose ratio would be 100× greater than noted here in Table 4 for composite conformal coatings within the Al enclosure.

| Composite | Energy (MeV) | | | | | |
|---|---|---|---|---|---|---|
| | 0.01 | 0.1 | 0.2 | 0.4 | 0.6 | 0.8 |
| Single Layer | | | | | | |
| 30% 30 µm Er$_2$O$_3$ | 0.2 | 2.5 | 1.2 | 1.05 | 1.03 | 1.01 |
| 70% 60 µm Er$_2$O$_3$ | 0.2 | 2.6 | 1.2 | 1.05 | 1.03 | 1.01 |
| 30% 30 µm WO$_3$ | 0.2 | 2.5 | 1.3 | 1.1 | 1.03 | 1 |
| 70% 60 µm WO$_3$ | 0.2 | 2.5 | 1.3 | 1.1 | 1.03 | 1 |
| 70% 60 µm Gd$_2$O$_3$ | 0.19 | 1.24 | 1.07 | 1.02 | 1.01 | 1.01 |
| Double Layer | | | | | | |
| 30% 30 µm Er$_2$O$_3$ | 0.09 | 7 | 1.6 | 1.1 | 1.06 | 1.04 |
| 70% 60 µm Er$_2$O$_3$ | 0.09 | 7.2 | 1.6 | 1.1 | 1.06 | 1.04 |
| 30% 30 µm WO$_3$ | 0.09 | 6.3 | 1.6 | 1.1 | 1.05 | 1.04 |
| 70% 60 µm WO$_3$ | 0.09 | 6.3 | 1.6 | 1.1 | 1.05 | 1.03 |
| 70% 60 µm Gd$_2$O$_3$ | 0.09 | 4.43 | 1.4 | 1.1 | 1.04 | 1.03 |
| Triple Layer | | | | | | |
| 30% 30 µm Er$_2$O$_3$ | 0.05 | 11 | 2 | 1.2 | 1.1 | 1.06 |
| 70% 60 µm Er$_2$O$_3$ | 0.05 | 11 | 1.6 | 1.2 | 1.1 | 1.06 |
| 30% 30 µm WO$_3$ | 0.05 | 10 | 2 | 1.2 | 1.1 | 1.05 |
| 70% 60 µm WO$_3$ | 0.05 | 10.4 | 2 | 1.2 | 1.1 | 1.06 |
| 70% 60 µm Gd$_2$O$_3$ | 0.05 | 7.4 | 1.6 | 1.1 | 1.1 | 1.04 |
| Quadruple Layer | | | | | | |
| 30% 30 µm Er$_2$O$_3$ | 0.04 | 13 | 2.3 | 1.2 | 1.06 | 1.1 |
| 70% 60 µm Er$_2$O$_3$ | 0.03 | 13 | 2.3 | 1.2 | 1.1 | 1.1 |
| 30% 30 µm WO$_3$ | 0.03 | 12 | 2.3 | 1.2 | 1.1 | 1.1 |
| 70% 60 µm WO$_3$ | 0.03 | 12 | 2.3 | 1.2 | 1.1 | 1.1 |
| 70% 60 µm Gd$_2$O$_3$ | 0.04 | 9 | 1.8 | 1.2 | 1.1 | 1.06 |

As expected with any composite, photon-induced displacement damage increased with incident energy regardless of conformal coat thickness, MO composition, or MO type (on a per photon basis). Even when the total number of displacements differed by 1% or less between the standard and composite conformal coating, the displacements per unit shield mass were significantly different due to the increasing total mass of the composite conformal coat with increasing MO percent composition. The highest mass composite conformal coat results are shown in Table 5 along with those from the standard conformal coating. The composite ranges from a factor of 1.3 (single layer) to 1.56 (quadruple layer) greater in mass than the standard conformal coat. From the values noted in Table 5, the MO content always results in a lower damage per mass ratio implying implicit gains with this approach for photon shielding by a minimum factor of 2.27 using the double layer configuration for WO$_3$ based composites. The other composite conformal coats have a minimum damage ratio difference with a single layer and a maximum damage ratio difference with a quadruple layer.

TABLE 5

Photon displacements per coating mass

| Composite | Energy (MeV) | | | | |
|---|---|---|---|---|---|
| | 0.8 | 1 | 4 | 8 | 14 |
| Single Layer | | | | | |
| 70% 60 µm Er$_2$O$_3$ | 76 | 340 | 3803 | 7791 | 11805 |
| 70% 60 µm Gd$_2$O$_3$ | 76 | 342 | 3828 | 7864 | 11962 |
| 70% 60 µm WO$_3$ | 71 | 319 | 3576 | 7333 | 11117 |
| No metal oxide | 182 | 816 | 9087 | 18709 | 28523 |
| Double Layer | | | | | |
| 70% 60 µm Er$_2$O$_3$ | 34 | 152 | 1709 | 3494 | 5251 |
| 70% 60 µm Gd$_2$O$_3$ | 34 | 153 | 1717 | 3515 | 5299 |
| 70% 60 µm WO$_3$ | 39 | 178 | 2000 | 4092 | 6161 |
| No metal oxide | 90 | 405 | 4516 | 9308 | 14183 |
| Triple Layer | | | | | |
| 70% 60 µm Er$_2$O$_3$ | 23 | 104 | 1164 | 2376 | 3545 |
| 70% 60 µm Gd$_2$O$_3$ | 23 | 105 | 1173 | 2399 | 3595 |
| 70% 60 µm WO$_3$ | 23 | 106 | 1200 | 2452 | 3670 |
| No metal oxide | 60 | 268 | 2993 | 6177 | 9408 |
| Quadruple Layer | | | | | |
| 70% 60 µm Er$_2$O$_3$ | 16 | 73 | 828 | 1688 | 2503 |
| 70% 60 µm Gd$_2$O$_3$ | 16 | 74 | 835 | 1706 | 2543 |
| 70% 60 µm WO$_3$ | 17 | 76 | 854 | 1744 | 2596 |
| No metal oxide | 45 | 200 | 2233 | 4614 | 7025 |

3.2 Neutrons

A single layer of MO-Acrylic composite attenuates the incident Watt spectrum in the 1 to 15 MeV energy range by an average of 13.5% with slight variations in standard deviation of each MO around 4%. Additional layers of MO-acrylic increase the attenuation in the 1-15 MeV range by 10% per layer; the highest attenuation (mean=45.5%) was observed with four layers ($\sigma_{WO_3-Acrylic}$=8%, $\sigma_{Gd_2O_3-Acrylic}$=4%, $\sigma_{Er_2O_3-Acrylic}$=5%)

The incident neutron spectra to the composite was insensitive to the Al enclosure. This is an expected result as the neutron capture cross section for Al is zero below 7 MeV and less than 0.5 barns above 7 MeV. However, the $^{27}$Al(n,γ) cross section follows an $E^{-0.5}$ relationship into the keV energy range, resulting in more photons produced with the Al enclosure. This contributed to the induced photon spectra, particularly in the 1-3 MeV range. Despite this, displacements from neutron-induced photons amounted to 0.0001% of neutron displacements for the same composite mass and so were neglected when determining neutron displacement damage.

98% of Si displacements occur with neutron energies between 0.01 and 7 MeV, with the peak displacements at 0.1 MeV. This energy range corresponds to the largest population of neutrons in the incident spectrum. The (n,2n) threshold energy for both the MO in the composite and the Al enclosure is 15 MeV (where the incident flux becomes very small). At this threshold energy and above, a factor of 3 increase in neutron fluence was observed with a corresponding increase in displacements for all layers. This effect was most pronounced in multilayer, high mass percent MO composites, but provided a negligible contribution to the total number of displaced Si atoms due to the lower incident flux at these higher energies (FIG. 2).

Figure 2:
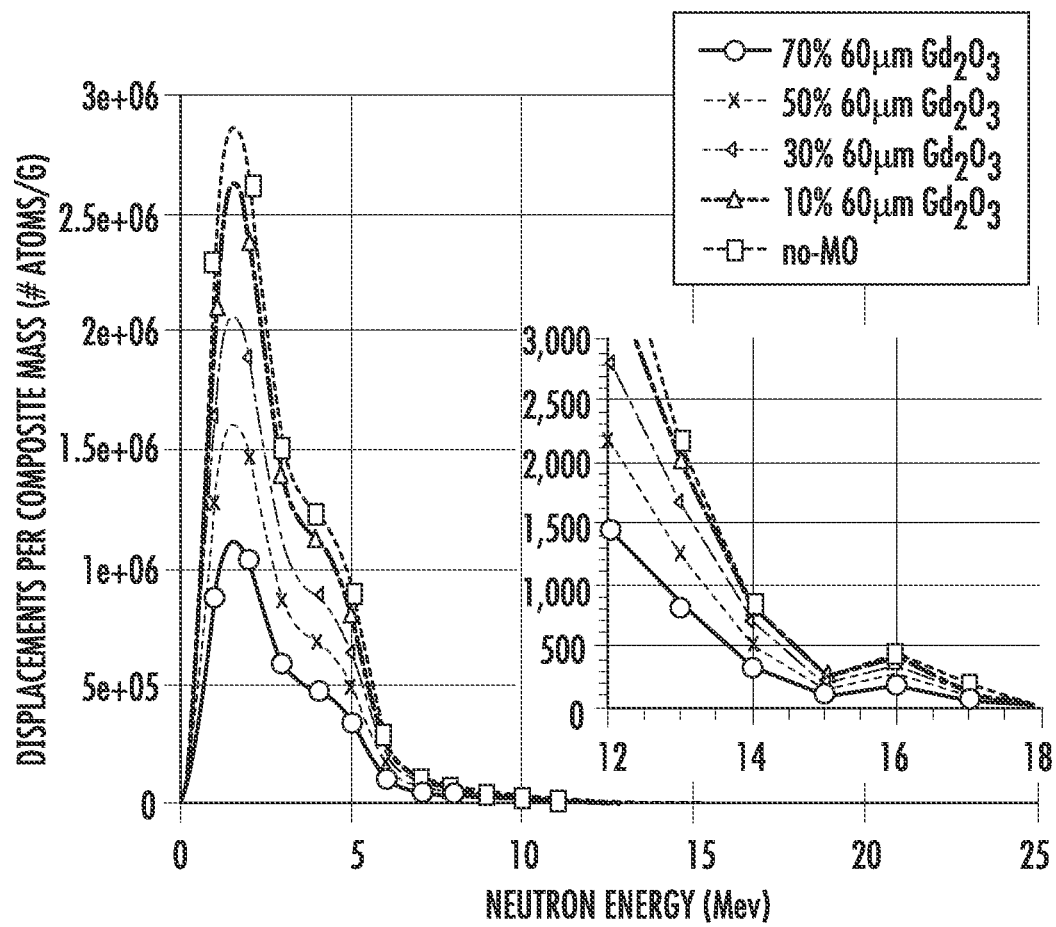
FIG. 2 is a graph illustrating the effect of metal oxide shielding by percent mass on silicon atom displacement where the shielding includes four composite conformal coat layers.

Displaced Si atoms per composite mass varies inversely with MO mass percent as shown in FIG. 2. This is consistent among all MO composites, with the lowest displacements observed in $Gd_2O_3$-acrylic composites. At minimum, a 12% reduction in peak displacement damage per unit coating mass between the standard conformal coat (no-MO) and 10% 60 µm $Gd_2O_3$ composite conformal coat was observed. Greater reductions can be realized with higher mass percent composites as noted in FIG. 2. This difference increases to 225% with the 70% 60 µm $Gd_2O_3$ composite conformal coat for 1-15 MeV neutrons. The data markers in FIG. 2 contain the calculation error among MO composite displacements (demonstrating small calculation error estimates). The modeling approach also predicted a slight sensitivity dependence on particulate as seen in FIG. 3.

4. Discussion and Conclusions

Military systems require novel approaches to function in harsh conditions. MO-acrylic conformal coats offer photon and neutron attenuation to sensitive electronics, primarily for a limited energy range. 10 keV photons are readily attenuated with each MO-acrylic combination, while attenuation for higher energy photons requires thicker and higher mass % composites of $Er_2O_3$ to attain equivalent shielding worth. Significant reductions in neutron displacement damage were observed with thicker, higher % mass composites of $Gd_2O_3$ (up to 225% reduction in neutron intensity in the 1-15 MeV range). Depending on the intended application, a potentially useful shield could be developed by intermixing individual layers of MO-acrylic (i.e. graded shielding). Also, the inclusion of nanoparticles, such as fullerenes, may simultaneously increase strength and/or improve flexibility.

Figure 3:
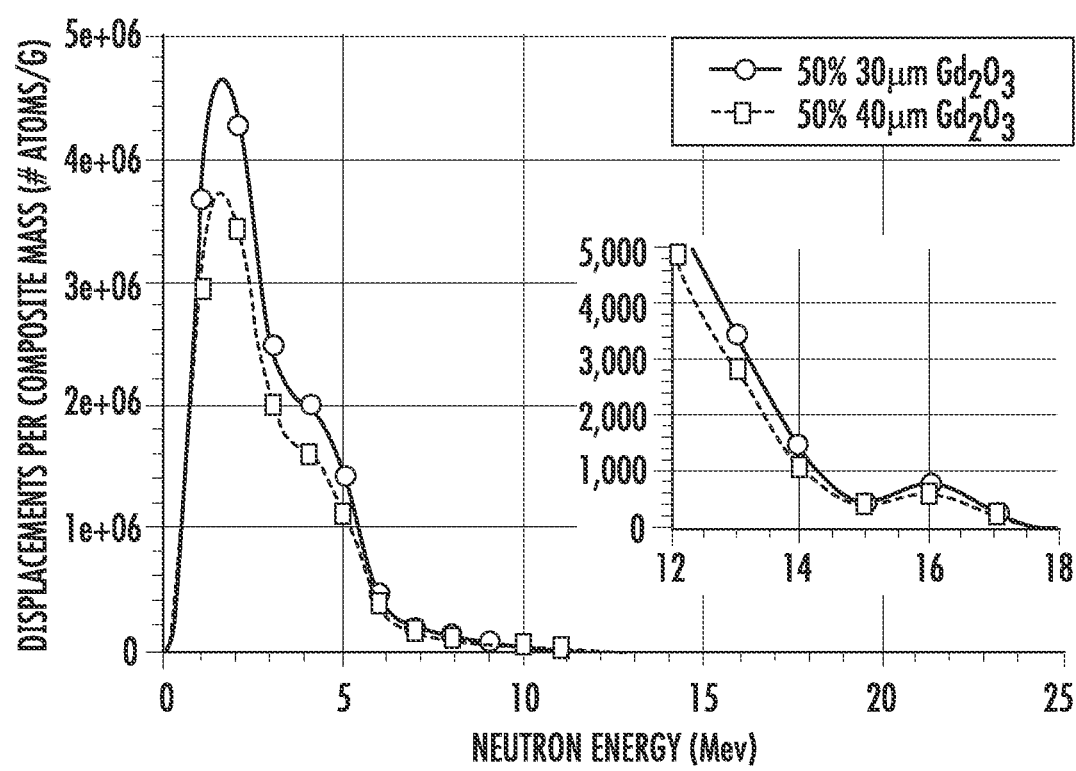
FIG. 3 is a graph illustrating an effect of particulate size and displacement vantage for $Gd_2O_3$ particulate coating with 30 and 40 micrometer diameters representing 50% by mass of the composite.

The particulate size dependency seen in FIG. 3 might be due to the Monte Carlo modeling used in that larger particulate sizes allow for larger coverage in their restrictive cell boundaries. The probability of streaming paths through pure acrylic will increase with smaller mass content but the larger size for an equal mass content implies a more homogeneous distribution per cell. As homogeneity is approached, the probability of streaming paths missing an MO particulate are decreased, resulting in a higher overall shielding worth as seen in FIG. 3.

The Al enclosure provides substantial shielding for 10 keV photons while offering only negligible attenuation to higher energy photons and neutrons. Composite conformal coats with >30% MO by mass can provide sufficient attenuation of 10 keV photons to potentially negate any shielding need from the Al enclosure for such an X-ray source. The Al enclosure is typically implemented as a rigid, electromagnetic shield and is unlikely to be removed for mass savings alone. However, since photon/neutron spectra show little change through the Al enclosure, the composite conformal coat does provide additional shielding. There is a mass penalty associated with these composite conformal coatings, 1.3 g for a single layer (1.31× standard conformal coat) to 10 g for four layers (1.56× standard conformal coat).

Composite shielding, most pronounced for 10 keV photons, indicates a general trend among MO composition. $WO_3$-acrylic composites have the least attenuation, while $Gd_2O_3$-acrylic has ~3× more and $Er_2O_3$-acrylic has ~4× more attenuation than $WO_3$. The trend for mass and density among the MO options is similar, with $Er_2O_3$ as the densest followed by $Gd_2O_3$ and $WO_3$. In terms of cost, however, $WO_3$ is the most expensive per unit mass. $Gd_2O_3$ is the least costly per unit mass. Thus, if optimizing for shielding worth per unit mass and cost, $Gd_2O_3$ might be considered as it is the least expensive and provides a high overall shielding worth. If the cost difference is inconsequential, $Er_2O_3$ would be the more attractive additive.

In practical applications, radiation shielding, cost, and mass must be balanced against other design requirements and considerations. Even though MIL-I-46058 is inactive, it is still commonly adhered to by the coatings industry. According to this specification, acrylic conformal coatings must be homogeneous, transparent, and 2 mils (50.8 µm) thick. Clearly, the analysis presented here will not meet this thickness requirement and the addition of a MO powder will likely result in an opaque product. An exception would have to be made for the proposed material such as using an overlaid label on the conformal coat to allow for circuit card rework (due to the lack of transparency). Additionally, the inclusion of metal oxides may also affect mechanical shock, thermal protection, electromagnetic compatibility, and other practical performance parameters of conformal coatings. These properties were not evaluated and are left for future evaluation, modification, and experimentation.

The disclosure of each of the following references is hereby incorporated herein by reference in its entirety.

Figure 4:
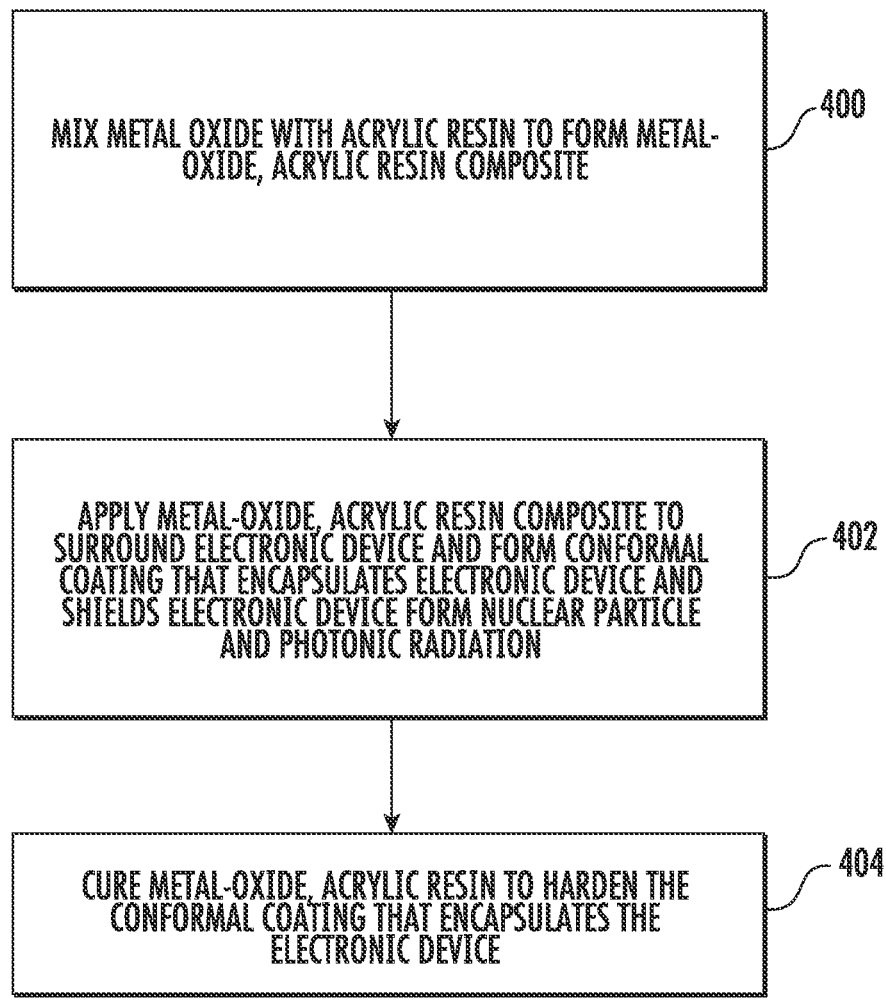
FIG. 4 is a flow chart illustrating an exemplary process for shielding an electronic device for resistance to nuclear particle and photonic radiation.

FIG. 4 is an exemplary process for shielding an electronic device for resistance to nuclear particle and photonic radiation. Referring to FIG. 4, in step 400, the process includes mixing a metal-oxide with an acrylic resin to form a metal-oxide, acrylic resin composite. For example, a metal-oxide, such as erbium trioxide, tungsten trioxide, or gadolinium trioxide can be mixed with an acrylic resin. The metal-oxide maybe in a powder or particulate form.

In step 402, the process includes applying the metal-oxide, acrylic resin composite to surround an electronic device and form a conformal coating that encapsulates the electronic device and shields the electronic device from nuclear particle and photonic radiation. For example, the metal-oxide acrylic resin composite can be brushed or sprayed onto an electronic device to shield the electronic device. In another example, the metal-oxide acrylic resin can be applied to the electronic device by dipping the electronic device into the metal-oxide acrylic composite. The metal-oxide, acrylic composite may be applied directly to the electronic device or an encapsulant that surrounds the electronic device. In one example, the encapsulant that surrounds the electronic device maybe alumina. In yet another example, the metal-oxide, acrylic composite maybe 3D printed on the encapsulant or printed to properly fit the encapsulant accordingly. In another example, metal-oxide, acrylic composite can be machined into a structure for surrounding the encapsulant.

In step 404, the metal-oxide, acrylic composite is cured to harden the conformal coating that encapsulates the electronic device. For example, the metal-oxide, acrylic resin maybe cured with or without the application of heat or UV exposure to form a hardened conformal coating that conforms to an out surface of an electronic device or encapsulant that surrounds an electronic device. The metal-oxide, acrylic resin maybe applied in plural layers to surround the electronic device. The number of layers may depend on the desired amount of shielding and mass percentage of the conformal coating with respect to the mass of the electronic device.

The metal oxide, acrylic composite materials described herein exist primarily in a liquid form at the time that they are formed for application or directly applied to the electronic device. Applying a metal oxide, acrylic composite in a liquid form to an electronic device enables the metal oxide, acrylic composite to conform to the outer surface of the electronic component without requiring a machining step after the electronic device is coated with composite and the composite cures. Forming the metal oxide, acrylic composite as a liquid also enables the composite to be poured or 3D printed onto the electronic device being shield and also enables the application of the composite to the electronic device by dipping. Such application methods are not available for conventional shielding materials that exist in solid or aggregate form at the time of application.

The disclosure of each of the following references is incorporated herein by reference in its entirety.

REFERENCES

[Belgin et al. (2015)] Belgin, E. E. & Aycik. G. A. (2015) Preparation and radiation attenuation performances of metal oxide filled polyethylene based composites for ionizing electromagnetic radiation shielding applications, *J Radioanal Nucl Chem*, 306, 107-117, DOI:10.1007/s10967-015-4052-2

[Brydson (1999)] Brydson, J. A. (1999). Acrylic Plastics in *Plastic Materials*, (pp. 423-424) Retrieved from http://ebookcentral.proquest.com/

[Chai et al (2016)] Chai, Hao et al. (2016). Preparation and properties of novel, flexible, lead-free x-ray shielding materials containing tungsten and bismuth(III) oxide, *Journal of Applied Polymer Science*, DOI:10.1002/app.43012

[Faw and Shultis (2000)] Faw, R. E. & Shultis, J. K. (2000). *Radiation Shielding*, New York: American Nuclear Society

[Harrison et al (2008)] Harrison, Courtney et al. (2008). Polyethylene/Boron Nitride Composites for space radiation shielding, *Journal of Applied Polymer Science*, 109, 2529-2538, https://doi.org/10.1002/app. 27949

[Kwon (2000)] Kwon, Junhyun and Motta, Arthur T. (2000), Gamma Displacement cross section in various materials, *Annuals of Nuclear Energy*, 2, 1627-1642, https://doi.org/10.1016/S0306-4549(00)00024-4

[Li et al (2017)] Li, R. et al. (2017). Gamma ray shielding property, shielding mechanism and predicting model of continuous basalt fiber reinforced polymer matrix composite containing functional filler, *Materials & Design*, 124, 121-130, https://doi.org/10.1016/j.matdes.2017.03.045

[Ma et al (2011)] Ma, J. et al. (2011). Fabrication, Structure and Properties of Epoxy/Metal Nanocomposites, *Macromolecular Material Engineering*, 296, 465-474, DOI: 10.1002/mame.201000409

[Mahmoud et al (2018)] Mahmoud, M. E. et al. (2018). Fabrication, characterization and gamma rays shielding properties of nano and micro lead-oxide dispersed-high density polyethylene composites, *Radiation Physics and Chemistry*, 145, 160-173, https://doi.org/10.1016/j.radphyschem.2017.10.017

[MCNP (2013)] Los Alamos National Laboratory. (2013 May). MCNP6 User's Manual, Version 1.0

[Murty (2013)] Murty, L. K. & Charit, I. (2013). *An Introduction to Nuclear Materials*, Singapore: Wiley-VCH

[Soylu et al (2015)] Soylu, H. M. et al. (2015). Gamma Radiation shielding efficiency of a new lead-free composite, *J Radioanal Nucl Chem*, 305, 529-534, DOI: 10.1007/s10967-015-4051-3

[Srour (2003)] Srour, J. R. et al. (2003). Review of Displacement Damage Effects in Silicon Devices, *IEEE Transactions on Nuclear Science*, 50, DOI: 10.1109/TNS.2003.813197

[USDoD (1972)] U.S. Department of Defense. (1972 Jul. 7). Military Specification, Insulating Compound, Electrical (For Coating Printed Circuit Assemblies). Retrieved from http://wwww.everyspec.com

[Wang et al. (2015)] Wang, Haibin et al. (2015). Preparation and Radiation Shielding properties of $Gd_2O_3$/PEEK Composites, *Polymer Composites*, 651-659, DOI:10.1002/pc.22983

[Zoller (1964)] Zoller, L. K. (1964). Fast Neutron Removal Cross Sections, Nucleonics, 22, 128-129

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A method for shielding an electronic device for resistance to nuclear particle and photonic radiation, the method comprising:
    mixing a metal oxide with an acrylic resin to form a metal-oxide, acrylic resin composite;
    applying the metal-oxide, acrylic resin composite to surround an electronic device and form a conformal coating that encapsulates the electronic device and shields the electronic device from nuclear particle and photonic radiation; and
    curing the metal-oxide, acrylic resin composite to harden the conformal coating that encapsulates the electronic device.

2. The method of claim 1 wherein the metal-oxide comprises a powder and wherein mixing the metal oxide with the acrylic resin includes mixing the powder with the acrylic resin to have a desired mass percentage of the metal oxide.

3. The method of claim 1 wherein the metal oxide comprises erbium trioxide.

4. The method of claim 1 wherein the metal oxide comprises tungsten trioxide.

5. The method of claim 1 wherein the metal oxide comprises gadolinium trioxide.

6. The method of claim 1 wherein applying the metal-oxide, acrylic composite to surround the electronic device comprises dipping the electronic device into the metal-oxide, acrylic composite, brushing or pouring the metal-oxide, acrylic composite onto the electronic device, or spraying the metal-oxide, acrylic composite onto the electronic device.

7. The method of claim 1 wherein applying the metal-oxide, acrylic composite to surround the electronic device includes applying the metal-oxide, acrylic composite to an encapsulant surrounding the electronic device.

8. The method of claim 7 wherein applying the metal-oxide, acrylic composite to the encapsulant includes 3D printing the metal-oxide, acrylic material onto the encapsulant or machining bulk metal-oxide composite material into a structure for surrounding the encapsulant.

9. The method of claim 7 wherein the encapsulant comprises a ceramic material.

10. The method of claim 9 wherein the ceramic material comprises alumina.

11. The method of claim 1 wherein the electronic device comprises a semiconductor device.

12. The method of claim 11 wherein the semiconductor device includes at least one silicon layer and at least one silicon oxide layer.

13. The method of claim 1 wherein the acrylic resin comprises a polymethyl acrylic resin.

14. The method of claim 1 wherein applying the metal-oxide, acrylic composite to surround the electronic device includes applying plural layers of the metal-oxide, acrylic composite to surround the electronic device.

15. A nuclear and photonic radiation resistant electronic device comprising:
    a semiconductor device; and
    a conformal coating that surrounds the semiconductor device and comprises a composite of a metal oxide and an acrylic resin for shielding the semiconductor device from nuclear particle and photonic radiation.

16. The electronic device of claim 15 wherein the semiconductor device includes at least one silicon layer and at least one silicon oxide layer.

17. The electronic device of claim 15 comprising an encapsulant surrounding the semiconductor device, wherein the conformal coating is located on an outer surface of the encapsulant.

18. The electronic device of claim 17 wherein the encapsulant comprises a ceramic material.

19. The electronic device of claim 18 wherein the ceramic material comprises alumina.

20. The electronic device of claim 15 wherein the metal oxide comprises erbium trioxide.

21. The electronic device of claim 15 wherein the metal oxide comprises gadolinium trioxide.

22. The electronic device of claim 15 wherein the metal oxide comprises tungsten trioxide.

23. The electronic device of claim 15 wherein the acrylic resin comprises a polymethyl acrylic resin.

24. The electronic device of claim 15 wherein the metal oxide comprises a powder suspended in the acrylic resin.

25. The electronic device of claim 15 wherein the conformal coating comprises plural layers of the composite of the metal oxide and the acrylic resin.

* * * * *